US011834541B2

(12) United States Patent
Nielsen et al.

(10) Patent No.: US 11,834,541 B2
(45) Date of Patent: Dec. 5, 2023

(54) COMPOSITIONS FOR FORMING POLYMER BRUSHES

(71) Applicant: RADISURF APS, Risskov (DK)

(72) Inventors: Stefan Urth Nielsen, Aarhus N (DK); Mikkel Skorkjaer Kongsfelt, Harlev J (DK)

(*) Notice: Subject to any disclaimer, the term of this patent is extended or adjusted under 35 U.S.C. 154(b) by 317 days.

(21) Appl. No.: 17/065,750

(22) Filed: Oct. 8, 2020

(65) Prior Publication Data
US 2021/0047456 A1 Feb. 18, 2021

Related U.S. Application Data

(63) Continuation of application No. PCT/DK2019/050112, filed on Apr. 10, 2019.

(51) Int. Cl.
C08F 293/00 (2006.01)
C08F 2/06 (2006.01)
C08F 2/10 (2006.01)
C08F 4/10 (2006.01)
C08F 4/26 (2006.01)
C08F 292/00 (2006.01)

(52) U.S. Cl.
CPC ............ C08F 293/005 (2013.01); C08F 2/06 (2013.01); C08F 2/10 (2013.01); C08F 4/10 (2013.01); C08F 4/26 (2013.01); C08F 292/00 (2013.01)

(58) Field of Classification Search
CPC .......... C08F 2/10; C08F 293/005; C08F 4/10; C08F 4/26; C08F 292/00
See application file for complete search history.

(56) References Cited

U.S. PATENT DOCUMENTS

2013/0090442 A1* 4/2013 Pugh .................... C08G 83/005
526/263
2014/0066593 A1 3/2014 Kim et al.

FOREIGN PATENT DOCUMENTS

WO 2015163383 10/2015
WO 2017132137 8/2017

OTHER PUBLICATIONS

Mapas et al. Macromolecules 2016, 49, 3733-3738 (Year: 2016).*
Susanne Hansson et al: ARGET ATRP for Versatile Grafting of Cellulose Using Various Monomers, ACS Applied Materials & Interfaces, vol. 1. No. 11, Nov. 25, 2009 (Nov. 25, 2009), pp. 2651-2659, XP055375613, US ISSN: 1944-8244, DOI: 10.1021/am900547g the whole document.
Nguyen et al., SET-LRP of Methyl Acrylate to Complete Conversion with Zero Termination, Journal of Polymer Science, Nov. 28, 2011, 860-873.

* cited by examiner

Primary Examiner — Mark S Kaucher
(74) Attorney, Agent, or Firm — Lambert Shortell & Connaughton; David J. Connaughton, Jr.; Justin P. Tinger

(57) ABSTRACT

The present invention relates to novel chemical solutions suitable for forming polymer brushes on a surface of a solid part. The present invention further relates to methods of forming polymer brushes on the surface of a solid part using the novel chemical solutions as well as solid parts having polymer brushes coated onto the surface and uses of such solid parts.

36 Claims, 6 Drawing Sheets

COMPOSITIONS FOR FORMING POLYMER BRUSHES

FIELD OF THE INVENTION

The present invention relates to novel chemical solutions (reaction compositions and polymerisation compositions) suitable for forming polymer brushes on a surface of a solid part. The present invention further relates to methods of forming polymer brushes on the surface of a solid part using the novel compositions as well as solid parts having polymer brushes coated onto the surface. Uses of such polymer brush-coated solid parts are also encompassed.

BACKGROUND OF THE INVENTION

Well-defined polymeric structures on solid parts have become increasingly important in many technologies. Such polymeric structures are often referred to as polymer brushes. Basically, polymer brushes are assemblies of macromolecules tethered at one end to a substrate, typically a solid part made of e.g. metal, plastic, ceramics as well as other solid materials. The emergence of new polymerisation techniques has facilitated the specific design and synthesis of polymer brushes with strict molecular control and desired properties. Polymer brushes have been explored during the past two decades, and they have previously had limited applications as functional surface coatings exhibiting long-term mechanical stability and chemical robustness. However, recently polymer brushes have been found to be more than nanoscale "building blocks" with a wide range of uses, varying from redox activity to biocompatibility and surface alteration, and due to the flexibility of the polymer brushes highly tailored thin films of polymer brushes can be created with respect to chemical composition, thickness, grafting density and architecture.

In fact, polymer brushes are a strong tool in the assembly of incompatible materials which cannot be readily combined by gluing or other conventional interlocking methods. Polymer brushes offer a practically invisible joining of materials, even those being transparent.

The formation of polymer brushes and the attachment to a solid surface is a specialist task and requires specialised equipment. Furthermore, the chemical reaction (polymerisation) is time-consuming and complicated. Thus, polymer brush-coated surfaces are mostly prepared at specialised facilities. One of the major challenges is that the reaction mixture required for the formation of polymer brushes are unstable, thus, requiring special reaction conditions, e.g. strict inert atmosphere and temperature control, in order to control the reaction and the formation of the polymer brushes.

Therefore, there is a need to develop methods and reagents for easier and less complicated manufacturing of polymer brush-coated surfaces.

SUMMARY OF THE INVENTION

In a first aspect, the present invention relates to reaction compositions. The reaction compositions are used for forming polymer brushes on the surface of solid parts. The reaction composition comprise at least one polymerisation composition and at least one activation agent. In particular, the polymerisation composition comprises one or more dormant transition metal catalysts, and the activation agent comprises one or more oxygen scavengers. A major advantage of the reaction compositions according to the invention is that the polymerisation compositions can be made stable upon storage, and further that the polymerization compositions can be activated on demand by the activation agent.

The reaction compositions preferably comprise at least one polymerisation composition and at least one activation agent provided as discrete compositions. Thereby, the polymerisation composition can be activated on demand.

In a second aspect, the present invention relates to methods of forming polymer brushes on solid parts. The methods comprise providing a solid part having polymerisation initiators immobilised on the surface of the solid part and further comprises bringing the solid part into contact with the reaction composition formed by mixing the polymerisation composition and the activation agent.

In a certain embodiment, the present invention relates to methods for forming polymer brushes on a solid part having polymerisation initiators immobilised on the surface of the solid part, wherein the method comprises the steps of providing a polymerisation composition and an activation agent, mixing the polymerisation composition and the activation agent to form a reaction composition, and bringing the reaction composition and the solid part into contact, thereby initiating surface polymerisation on the solid part, whereby polymer brushes are formed via the polymerisation initiators on the surface of the solid part.

The present invention further relates to polymer brush-coated solid parts, which are obtainable by the method according to the invention.

The present invention also contemplates the use of the reaction compositions according to the invention for forming polymer brushes on the surface of solid parts.

The present invention makes possible the use of the polymer brush-coated solid parts for preparing various products for various purposes.

Polymerisation compositions also form part of the present invention. The polymerisation compositions comprise one or more dormant transition metal catalysts. The polymerisation compositions have a unique stability, thereby making possible storage over a period of time, while retaining the reaction ability. The polymerisation compositions can be activated on demand due to the presence of the one or more dormant transition metal catalysts.

DESCRIPTION OF THE DRAWINGS

Certain embodiments of the present invention are illustrated in the accompanying drawings. The drawings are in no way intended to limit the invention.

DETAILED DESCRIPTION OF THE INVENTION

Figure 1:
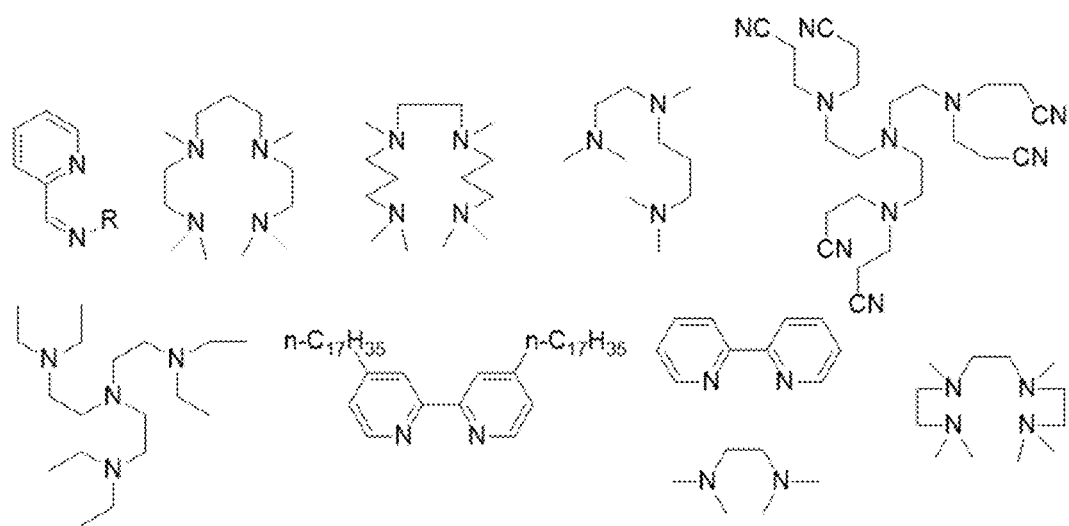
FIG. 1 illustrates certain suitable ligands (nitrogen-containing compounds) of the polymerisation composition.

The invention and its aspects are described in more detail in the following.

The invention relates to reaction compositions comprising at least one polymerisation composition, and at least one activation agent, wherein the at least one polymerisation composition comprises one or more dormant transition metal catalysts, and wherein the activation agent comprises one or more oxygen scavengers.

The polymerisation composition comprises at least one dormant transition metal catalyst, i.e. the polymerisation composition may comprise one dormant transition metal catalyst, or more than one dormant transition metal catalyst. E.g. the polymerisation composition may comprise two, three, four, five, or more dormant transition metal catalysts. In some embodiments, several polymerisation compositions, such as two, three, or four, may be provided, each or some of the polymerisation compositions comprising one or more transition metal catalysts.

The dormant transition metal catalyst may suitably be derived from copper (Cu), iron (Fe), aluminium (Al), cadmium (Cd), tungsten (W), rhenium (Re), ruthenium (Ru), platinium (Pt), titanium (Ti), manganese (Mn), nickel (Ni), samarium (sm), or palladium (Pd). Combinations of such dormant transition metal catalysts are also encompassed. Non-limiting examples of dormant transition metal catalysts include the following:

Cu: $Cu_2O$, CuO, and Cu(0)
Fe: FeO, $Fe_2O_3$, $Fe_3O_4$
Sm: $Sm_2O_3$
Al: $Al_2O_3$
Cd: CdO
W: $WO_3$
Re: $ReO_3$, $Re_2O_7$
Ru: $RuO_2$
Pt: $PtO_2$
Ti: $TiO_2$
Mn: $MnO_2$
Ni: NiO
Pd: PdO The dormant metal may in particular be provided in combination with a ligand capable of coordinating with the transition metal. Thereby, the catalytic effect is achieved. Thus, the transition metal associated with the ligand forms the transition metal catalyst, and can be dormant or activated.

In general, the transition metal become dormant (inactive) when oxidised.

In one embodiment, the one or more dormant transition metal catalyst is derived from copper (Cu). In particular, when the one or more dormant transition metal catalyst is derived from copper (Cu), the transition metal catalyst may be selected among $Cu_2O$, CuO, Cu(0), and $CuSO4*5H2O$. Combinations of such transition metal catalysts are also encompassed.

In another embodiment, the one or more dormant transition metal catalyst is derived from iron (Fe). In particular, when the one or more dormant transition metal catalyst is derived from iron (Fe), the transition metal catalyst may be selected among FeO, $Fe_2O_3$, and $Fe_3O_4$. Combinations of such transition metal catalysts are also encompassed.

In a third embodiment, the dormant transition metal catalyst is derived from copper (Cu) and iron (Fe) in combination. Thus, the dormant transition metal catalyst may be combinations of $Cu_2O$, CuO, Cu(0), and $CuSO4*5H2O$, and FeO, $Fe_2O_3$, and $Fe_3O_4$.

The dormant transition metal catalysts are able to initiate polymerisation upon activation.

In one embodiment of the reaction composition of the present invention, the polymerisation composition or compositions, and the activation agent or agents are provided as discrete solutions, powders or particulate preparations. Providing the polymerisation composition(s) and activation agent(s) as separate or discrete solutions, powders, or particulate preparations ensure a beneficial stability of the polymerisation composition since the dormant transition metal catalyst(s) cannot be transformed or regenerated into its active form without the presence of the activation agent(s).

The activation agent or agents comprise(s) one or more oxygen scavengers. The oxygen scavenger(s) of the activation agents(s) are capable of activating the dormant transition metal catalyst(s) of the polymerisation composition(s) by consuming oxygen from the solution. Hence, removal of oxygen enables the dormant metal catalyst to regenerate to the active metal catalyst. The oxygen scavenger(s) may to some extend also directly reduce the dormant metal catalyst to the active metal catalyst. As mentioned above, the dormant metal catalyst is formed between a transition metal and a ligand.

In some embodiments, the oxygen scavenger of the activation agent is selected from sodium ascorbate (NaAsc), ascorbic acid, hydrazine, hydrazine hydrate, sodium hypophosphite, a mixture of iron powder and sodium chloride, hydrogen carbonate, citric acid, and pyrogallic acid, as well as mixtures thereof. In a certain embodiment, the oxygen scavenger is selected from sodium ascorbate and/or ascorbic acid. In particular, the oxygen scavenger may be provided as a solution, a powder or a particulate preparation.

In order for a polymerisation reaction to proceed, the reaction composition further comprises one or more monomers. The one or more monomers may be provided as part of the polymerisation composition and/or as part of the activation agent. Furthermore, the one or more monomers may be provided as a separate or as a discrete composition to be mixed with the polymerisation composition and the activation agent, thereby forming the reaction composition. Non-limiting examples of monomers include acrylates, methacrylates, halogen-substituted alkenes, acrylamides, methacrylamides, and styrenes, as well as mixtures thereof. The monomer may optionally have functional groups assisting in the disproportionation of the active transition metal catalyst. Non-limiting examples of functional groups include amide, sulfoxide, carbonate, and onium.

Specific acrylate monomers include, but are not limited to, methyl acrylate, and ethyl acrylate, lauryl acrylate. Specific methacrylate monomers include, but are not limited to, methyl methacrylate (MMA), 2-hydroxyethylmethacrylate (HEMA), glycidyl methacrylate (GMA), ethyl methacrylate, and butyl methacraylate, lauryl methacrylate. Specific halogen-substituted alkene monomers include, but are not limited to, vinyl chloride, vinylidene difluoride, tetrafluoroethylene, chlorotrifluoroethylene, and hexafluoropropylene. Specific acrylamides monomers include, but are not limited to, acrylamide, N-isopropylacrylamide, N-tert-butylacrylamide, and N-hydroxyethyl acrylamide. Specific methacrylamide monomers include, but are not limited to, N-isopropylmethacrylamide, methacrylamide, N-tert-butylmethacrylate, and N-hydroxyethyl methacrylate. Specific styrene monomers include, but are not limited to, styrene, 4-methylstyrene, 2,3,4,5,6-pentafluorostyrene, p-divinylbenzene, and 4-chloro-styrene.

The reaction composition may further as mentioned comprise one or more ligands which combine with the transition metal. The one or more ligands may be provided as part of the polymerisation composition and/or as part of the activation agent. Furthermore, the one or more ligands may be provided as a separate or discrete solution to be mixed with the polymerisation composition and the activation agent, thereby forming the reaction composition. To ensure sufficiently availability of the ligand for the transition metal, the ligand is preferably added in excess. Specific ligands include, but are not limited to, nitrogen-containing ligands, such as N,N,N',N'',N'''-pentamethyldiethylenetriamine (PMDETA), tris[2-(dimethylamino)ethyl]amine (Me$_6$TREN), tris(2-aminoethyl)amine (TREN), tris(2-pyridylmethyl) amine (TPMA), and 2,2'-bipyridil (BiPy).

The reaction composition may further comprise one or more solvents. The one or more solvents may be provided as part of the polymerisation composition and/or as part of the activation agent. Furthermore, the one or more solvents may be provided as a separate or discrete solution to be mixed with the polymerisation composition and the activation agent, respectively, thereby forming the reaction composition. Specific solvents include, but are not limited to, alcohols, dipolar aprotic solvents, methylene carbonate, ethylene carbonate, propylene carbonate, ethyl lactate alcohol, ionic liquids, and water, as well as mixtures thereof. In case of the polymerisation composition, methanol and/or ethanol may be suitable solvents, since methanol and ethanol can act as suitable carriers for the dormant transition metal catalyst and optionally the monomers, if monomers are present in the polymerisation composition. In case of the activation agent, water may be a suitable solvent. The concentration of each of the components or compounds in the compositions/agents is typically in the range of from 0.1 nM to 35 M. Specific examples include, but are not limited to, 1 nM, 5 nM, 10 nM, 50 nM, 1 M, 5 M, 10 M, 20 M, and 30 M. It is to be understood that the concentration of each of the components or compounds may be the same or may be different. In certain embodiments, the monomer concentration may be from 0.01 M to 5 M. In certain embodiments, the concentration of the oxygen scavenger may be from 0.010 to 0.045 M. In a certain embodiment, the concentration of the ligand is 0.046 M. In a certain embodiment, the concentration of the solvent is from 0.1 to 35 M. In certain embodiments, the concentration of the catalyst is from 1.0 PPB to 500.0 PPM.

Thus, the reaction composition of the invention is such, wherein the dormant transition metal catalyst is activated by mixing the polymerisation composition and the activation agent. As mentioned above, the polymerisation composition and/or the activation agent may optionally comprise additional compounds such as monomers, ligands, solvents, or mixtures thereof. These additional compounds may optionally be provided as discrete compositions to be mixed with the polymerisation composition and/or the activation agent.

The polymerisation composition may suitably be prepared by adding the dormant transition metal catalyst to a suitable solvent in several ways, e.g. (1) be adding the transition metal catalyst as a nanoparticle powder and then oxidise the powder by air mainly to the dormant form, (2) by preparing the transition metal catalyst in situ from disproportionation of a salt of the transition metal catalyst followed by oxidation by air to mainly create the dormant form, (3) by adding a solid form of the transition metal catalyst to the solvent, spinning (stirring) the mixture to create and liberate nanoparticles of the transition metal catalyst into the solvent, and subsequent oxidising metal particles by air, and (4) passing it through a Cu tubing or a Cu filled packed bed reactor in flow. The preparation of the polymerisation composition may preferably take place at room temperature.

The activation agent may suitably be prepared by mixing the various components and optionally by stirring. The preparation of the activation agent may preferably take place at room temperature, but any temperature may be suitable.

Once the polymerisation composition and the activation agent are prepared, they can be stored until use. An excellent storage stability of months to years is expected, since each is dormant, i.e. no chemical reactions can take place. The polymerisation composition and the activation agent may be stored at any suitable temperature. In some embodiments, they may be stored at a reduced temperature, such as e.g. below 5° C. or below 8° C.

An important aspect of the present invention is a method of forming polymer brushes on a solid part, the method comprising
  providing the solid part having polymerisation initiators immobilised on the surface of the solid part,
  the method further comprising the steps of
  bringing the solid part into contact with the reaction composition as defined herein formed by mixing the polymerisation composition and the activation agent.

In a special embodiment of the method, the method comprises the steps of
  providing a polymerisation composition as defined herein,
  providing an activation agent as defined herein,
  mixing the polymerisation composition and the activation agent to form a reaction composition as defined herein, and
  bringing the reaction composition and the solid part into contact, thereby initiating surface polymerisation, whereby polymer brushes are formed via the polymerisation initiators on the surface of the solid part.

In some embodiments of the method according to the invention, the presence of oxygen may be reduced in order to facilitate the formation of the polymer brushes. The presence of oxygen may suitably be reduced by 70% or more, such as e.g. 70%, 75%, 80%, 85%, 90% or 95%. However, the formation of the polymer brushes may be done in atmospheres with oxygen concentrations from 0-100%. In a certain embodiment, the formation of polymer brushes take place under usual atmospheric conditions.

The solid part may suitably be made from metal (e.g. aluminium, steel, titanium, nickel, gold, silver, platinum, chrome, copper, iron, and alloys of various metals), glass, carbon or graphite, ceramics, composite, or plastics, or materials comprising an outer coating of such materials. The solid part may be electrically conducting or non-conducting.

The solid part has polymerisation initiators immobilised on the surface. Thus, the solid part becomes activated (activated solid part). Methods of attaching such polymerisation initiators are well-known in the art. Methods of immobilising polymerisation initiators are e.g. described in WO 2014 075695 A1. In general, the polymerisation initiators are such which can be covalently bonded to the surface of the solid part.

Figure 3A:
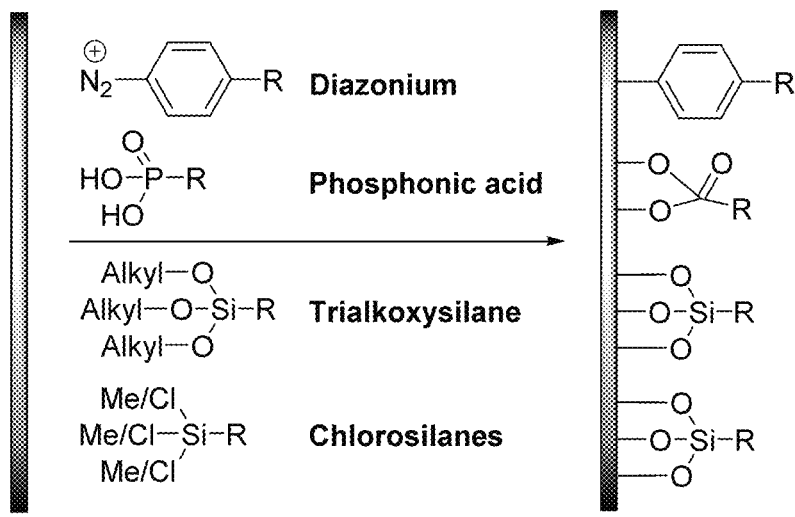
FIG. 3A illustrates polymerisation initiators immobilised using grafting.
Figure 3B:
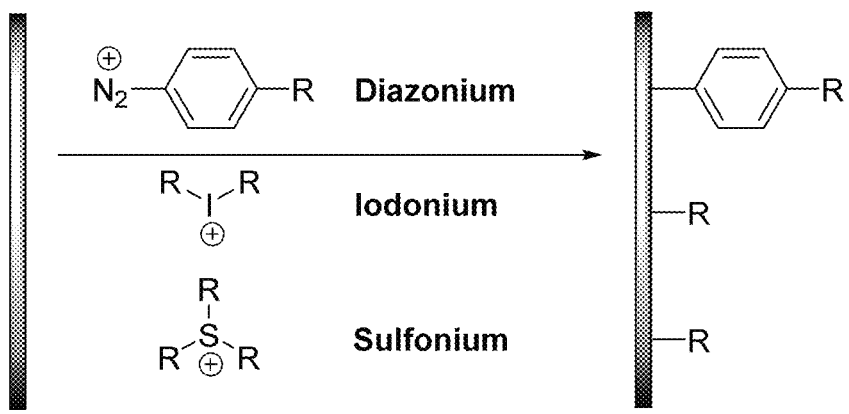
FIG. 3B illustrates polymerisation initiators immobilised using grafting.

The polymerisation initiators can be made with a predefined surface chemistry so as to enable immobilisation onto the surface of the solid part, depending on the material of which the solid part is made, but also depending on the characteristics of the polymer brush to be formed. Immobilisation of initiators usually involves attachment of organic molecules to the surface of the solid part by spontaneous grafting or electro grafting. Types of spontaneous grafting includes but are not limited to silane, phosphonic acid, and diazonium grafting. Types of electro grafting includes but are not limited to diazonium, iodonium, and sulfonium grafting. The generic grafting of such compounds can be seen in FIG. 3A and FIG. 3B.

Figure 4:
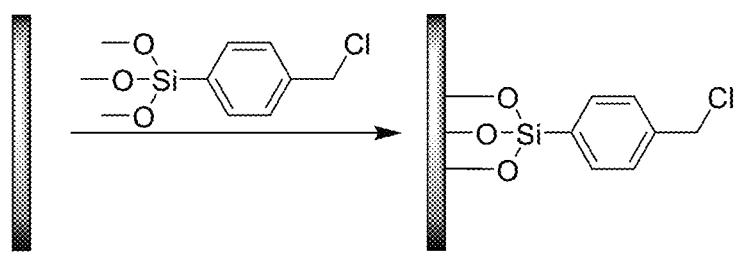
FIG. 4 illustrates 1-step (silane grafting) immobilisation of initiator molecule on a surface.

Attachment of polymerisation initiators to the surface can be done in either a 1-step or 2-step process. The 1-step approach uses the grafting of benzyl halide (mostly benzyl chloride) moieties onto the surface either by diazonium or silane grafting (see FIG. 4. And FIG. 5. for the silane grafted version). The benzyl halide moiety acts as the polymerization initiator of the graft layer. The 2-step approach is based on surface grafting an initial organic compound with a nucleophilic group and in a second step using the nucleophilic group to attach an initiator moiety (see FIG. 6. for the hydroxyl diazonium version). The nucleophile may include hydroxyl or amine group but not limited to. In a second step the nucleophile is reacted with an electrophile to add an initiator moiety, forming a covalent bond between the two. Immobilisation is further described below:

Silane Grafting 1-Step:

Initiators can be immobilized on a surface in one step by silane grafting of trialkoxysilane with benzyl halide groups (see FIG. 4).

The silane grafting is normally done in one of two ways, either by vapor deposition or in solution grafting.

Figure 5:
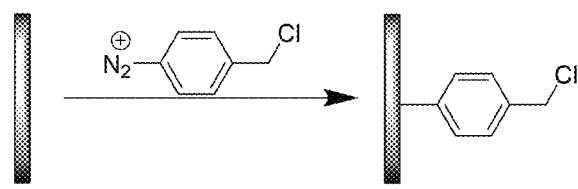
FIG. 5 illustrates 1-step (diazonium grafting) immobilisation of initiator molecule on a surface.

Diazonium Grafting 1-Step:

Initiators can be immobilized on a surface in one step by diazonium grafting of diazonium salts with benzyl halide groups (see FIG. 5).

The diazonium grafting is normally done in one of three ways, either by electrochemical, spontaneous, or chemical grafting.

Figure 6:
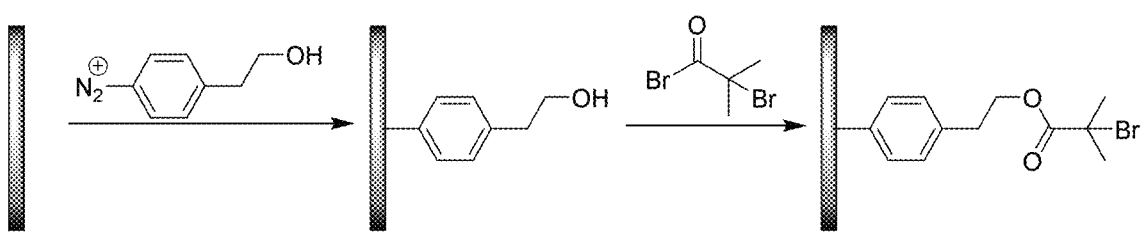
FIG. 6 illustrates 2-step (diazonium grafting) immobilisation of initiator molecule on a surface.

Diazonium Grafting 2-Step:

Another route of initiator immobilization is by a two-step process (see FIG. 6). The first step being diazonium grafting of a diazonium salt that contains a nucleophilic group (OH). In a second step a nucleophilic acyl substitution reaction adds a halogen containing group, giving the immobilized polymerization initiator.

Other ways of immobilising initiators are well-known in the art.

By the method of the invention, the solid part having polymerisation initiators immobilised onto the surface is brought into contact with the polymerisation composition and the activation agent. Mixing of the polymerisation composition and the activation agent results in the formation of the reaction composition, which upon contact with the solid part having polymerisation initiators immobilised thereof (i.e. activated solid part) enables formation of polymer brushes via the polymerisation initiators on the surface of the solid part. It is to be understood and as described above that other components or solutions may also be mixed with the polymerisation composition and the activation agent, e.g. monomers, ligands etc. These additional components or compounds may either be a part of the polymerisation composition or the activation agent, or, may be provided as discrete solutions or components. It is further to be understood that the polymerisation composition, the activation agent, and optionally other solutions or components may be mixed prior to contact with the solid part, or, may be mixed upon contact with the solid part.

Suitable polymerisation compositions, activation agents, and optional other solutions or components are those specified above.

In one embodiment of the method of the invention, the solid part having polymerisation initiators immobilised thereon is immersed into the reaction composition. The formation of polymer brushes may take place at ambient conditions (temperature, atmosphere).

In another embodiment of the method of the invention, the reaction composition is sprayed or painted onto the solid part. The reaction composition may further be brought into contact with the solid part by applying a liquid film to the surface of the solid part having polymerisation initiators immobilised thereon, e.g. by applying the so-called spincoating and dropcoating techniques and the like.

In certain embodiments, the solid part is selected from metal or alloy, glass, ceramics, plastics, carbon-based materials, and composite materials, or combinations thereof. Non-limiting examples are stainless steel, glassy carbon, and thermoplastics.

The reaction composition may in some embodiments be cooled or heated prior to or during contact with the solid part. Suitable temperatures are from −20° C. up to 120° C., such as from room temperature (approximately 20° C.) to 120° C. Specific temperatures include, but are not limited to, −20° C., 0° C., room temperature (approximately 20° C.), 30° C., 50° C., 60° C., 70° C., 80° C., 90° C., 100° C., 110° C., and 120° C.

The solid part having polymerisation initiators immobilised thereon and the reaction composition are typically kept in contact with each other for a suitable period of time, such as from 0.1 seconds to 5 hours. The suitable period of time includes, but are not limited to, 1 second, 2 seconds, 30 seconds, 1 minute, 5 minutes, 30 minutes, 1 hour, 2 hours, 3 hours, 4 hours and 5 hours.

For some applications, the method of the invention may be repeated in order to form another layer of polymer brushes on top of the existing. Thereby, so-called block polymers may be formed on the solid part. It is to be understood that the repeated method may involve polymers different from those used when forming the first layer of polymer brushes. The method of the invention may be repeated more than once in order to prepare more complex nature of the polymer brushes. For preparing block polymers, halogen atoms on the previously formed polymer brush may suitably be used for the further forming of polymer brushes.

The invention further relates to polymer brush-coated solid parts which are obtainable by the method as described herein. Such solid parts having polymer brush-coated surfaces prepared by the method according to the invention find many applications. Non-limiting examples are for adhesion, corrosion resistance, for providing antibacterial surfaces or low-friction surfaces, and for preparing ornamental designs.

Figure 2:
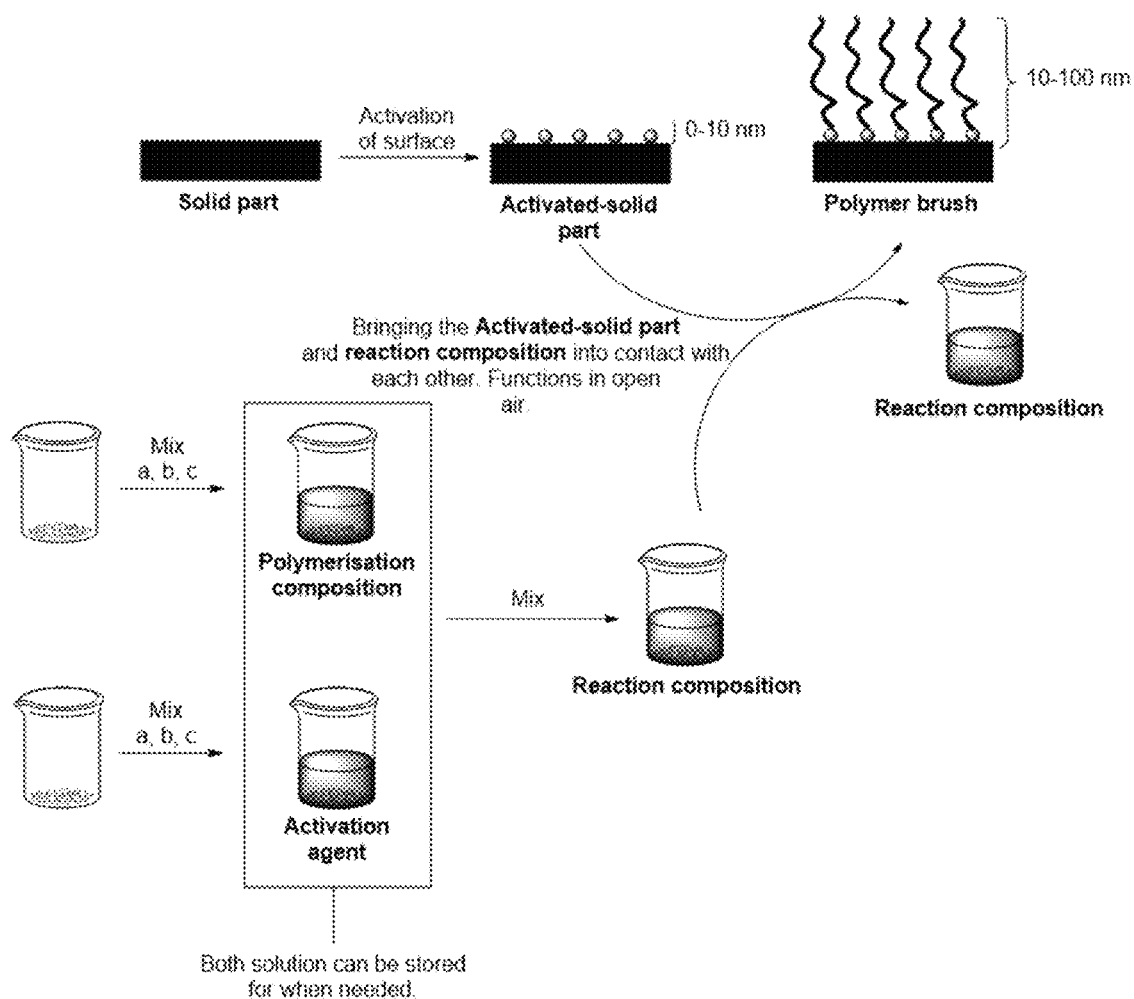
FIG. 2 illustrates the method of the invention.

The principle of the method of the invention is illustrated in FIG. 2. As can be seen from the figure, a solid part having polymerisation initiators immobilised thereon (activated solid part) is provided. The so activated solid part is brought into contact with the reaction composition (obtained by mixing a polymerisation composition and an activation agent). As shown, each of the polymerisation composition and activation agent (or both) may comprise one or more discrete solutions. When mixed, the reaction composition is formed. Once the reaction composition and the solid part are brought into contact (at a suitable temperature for a suitable period of time), the polymer brushes are formed on the surface of the solid part.

The polymer brushes (polymer brush structures) may be used for various applications, including, but not limited to the bonding of polymer materials to metals for sealing applications, bonding of functional thermoplastics to glass for sensor applications, efficient bonding of polymer brush coated composite fillers, like carbon fibres, graphene, particles etc. into the matrix of a polymer, e.g. a thermoplastic material, for creating functional surfaces, e.g. antibacterial surfaces, low friction surfaces or super hydrophobic self-cleaning surfaces on glass, metal, plastic etc.

Thus, in accordance with the above, the present invention relates to the use of polymer brushes prepared according to the methods disclosed herein for bonding of polymer materials to metals, for bonding of functional thermoplastics to glass, for bonding of polymer brush functionalized composite fillers into the matrix of polymers as a composite material, for creating functional surfaces on glasses, metals or plastic materials, for creating low friction surfaces on glasses, metals or plastic materials, and for creating self-cleaning surfaces on glasses, metals or plastic materials.

The present invention is further illustrated by the following non-limited examples.

EXAMPLES

Example 1

Preparation of Polymer Brushes from 2-Hydroxyethyl Methacrylate (HEMA)

Preparation of the Polymerisation Composition:

12 mL water, 6 mL methanol (MeOH), 12 mL HEMA, and 0.2208 mL N,N,N',N'',N''-pentamethyldiethylenetriamine (PMDETA—ligand) were mixed in a flask. To the flask was added a Cu wire wrapped Teflon magnet which was rotated in the flask at 400 rpm for 2 or 5 hours, depending on the desired concentration of Cu spices. The two different arbitrary Cu concentrations were denoted "2/5" and "5/5". Afterwards the Cu wire wrapped Teflon magnet was removed, and the solution was stored at 2-5° C. until use.

Polymerisation in 5/5 Solution:

5 mL of 5/5 polymerisation composition was argon purged for 3 minutes. Now 9 mg/mL of NaAsc (activation agent) was added to the polymerisation composition, thus, forming the reaction composition, together with an activated solid part (glassy carbon). The reaction composition was stirred together with the activated solid part (glassy carbon) for 40 minutes.

After the polymerisation, the now polymer brush coated solid part was removed from the solution and washed with acetone. This process yielded evenly formed polymer brushes with a thickness of 28.0 nm.

Polymerisation in 2/5 Solution:

5 mL of 2/5 polymerisation composition was argon purged for 3 minutes. Now 9 mg/mL of NaAsc (activation agent) was added to the polymerisation composition, thus, forming the reaction composition, together with an activated solid part (glassy carbon). The reaction composition was stirred together with the activated solid part for 40 minutes.

After the polymerisation, the now polymer brush coated solid part were removed from the solution and washed with acetone. This process yielded evenly distributed polymer brushes with a thickness of 33.6 nm.

Polymerisation by Liquid Film on the Surface:

4 mL of 5/5 polymerisation composition was argon purged for 3 minutes. Now specific amounts (2 mg/mL, 5 mg/mL, and 9 mg/mL) of NaAsc (activation agent) as a powder was added to the polymerisation composition, thus, forming the reaction composition. A thin liquid film (0.02 mL/cm$^2$) of the reaction composition was placed on the surface of an activated solid part (glassy carbon) and left to react for 10 minutes, then washed with 1) demineralised water, 2) acetone, and 3) pentane. This process of adding a thin liquid film of the reaction composition to the surface of the activated solid part, reacting and washing were repeated 3 times.

After the polymerisation, the liquid film was cleaned off the now polymer brush coated solid part. An evenly formed layer of polymer brushes was observed on the solid part.

Spray Polymerisation:

6 mL of 5/5 polymerisation composition was argon purged for 3 minutes. Now the solution was transferred to a spray and specific amounts (2 mg/mL, 5 mg/mL, and 9 mg/mL, respectively) of NaAsc (activation agent) were added to yield a reaction composition in spray form. An activated solid part (glassy carbon) was spray-coated with the reaction composition on the surface. The spray-coated surface was left to react for 10 minutes and then washed off. The process of spray-coating, reaction and washing was repeated 4 times.

After the polymerisation, the now polymer brush coated solid part was washed by sonication in 1) demineralised water, 2) HPLC-acetone, and 3) pentane.

The polymer brush coated solid part was inspected, and it was observed that an evenly distributed layer of polymer brushes was formed on the solid part.

Polymerisation using Cu Nanoparticles (NP's) as Catalyst:

12 mL water, 6 mL methanol (MeOH), 12 mL HEMA, 0.2208 mL N,N,N',N'',N''-pentamethyldiethylenetriamine (PMDETA—ligand), and 1 mg Cu$_2$O nanoparticles (NP) (diameter less than 250 nm) (polymerisation composition) are mixed in a flask. The solution is stored at 2-5° C. until use.

5 mL of the above-mentioned polymerisation composition is argon purged for 3 minutes. Now, 9 mg/mL NaAsc (activation agent) as a powder is added, thus, forming the reaction composition together with an activated solid part (glassy carbon). The reaction composition is stirred together with the activated solid part for 40 minutes.

After the polymerisation, the now polymer brush coated solid part is washed by sonication in 1) demineralised water, 2) HPLC-acetone, and 3) pentane.

Example 2

Preparation of Polymer Brushes from Glycidyl Methacrylate (GMA) Monomers

Preparation of Polymerisation Compositions with Different Cu Concentrations:

A Cu-wire wrapped Teflon magnet was stirred for 30 minutes in a solution of 5 mL DI-water and 0.050 mL PMDETA. Afterwards, the Cu-wire wrapped Teflon magnet was flushed with HPLC-acetone and was transferred to another glass container.

Now, to the second glass container with the prepared Cu-wire wrapped Teflon magnet 32.46 mL MeOH, 32.46 DI-water, and 0.729 mL N,N,N',N'',N''-pentamethyldiethylenetriamine (PMDETA—ligand) were added. The Cu-wire wrapped magnet was stirred in the solution at 400 rpm for a sufficient time to yield the desired concentration of Cu catalyst spices. Afterwards, the Cu-wire wrapped Teflon magnet was removed, 9.99 ml GMA was added, and the solutions were stored at 2-5° C. until use.

Figure 7:
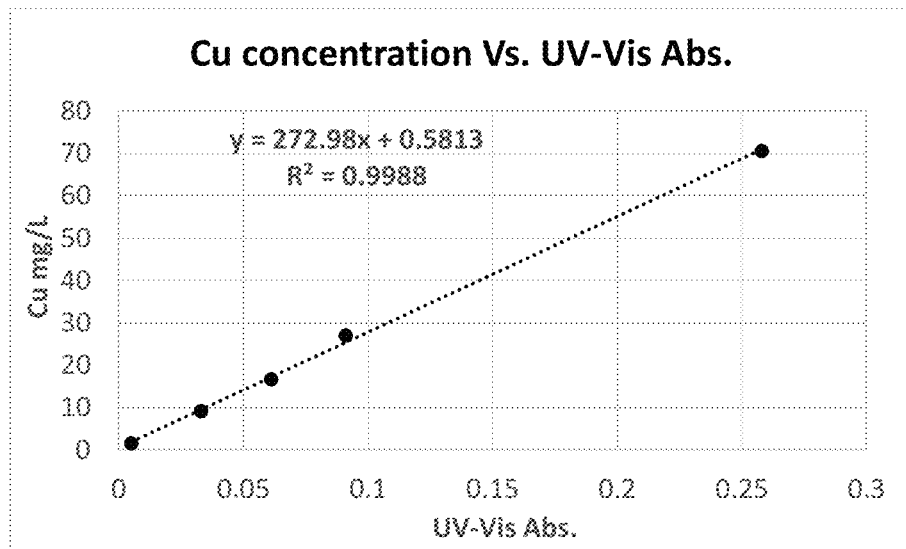
FIG. 7 shows the Cu catalyst concentration using atomic adsorption spectroscopy (ASS) versus UV-VIS peak absorbance.

The concentration of the Cu catalyst in each of the solutions was determined using atomic adsorption spectroscopy (AAS). The concentration determined from AAS was correlated with UV-VIS peak intensity to easily determine the concentration of Cu catalyst. FIG. 7 shows the Cu concentration versus UV-VIS peak intensity for solutions with different Cu catalyst concentrations.

The Polymerisation in 5/5 Solution with 9 mg/mL Activation Agent:

5 mL of 5/5 polymerisation composition was argon purged for 3 minutes. Now 9 mg/mL of NaAsc (activation agent) was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 5/5 Solution with 5 mg/mL Activation Agent:

5 mL of 5/5 polymerisation composition was argon purged for 3 minutes. Now 5 mg/mL of NaAsc (activation agent) was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 5/5 Solution with 2 mg/mL Activation Agent:

5 mL of 5/5 polymerisation composition was argon purged for 3 minutes. Now 2 mg/mL of NaAsc (activation agent) was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 4/5 Solution with 9 mg/mL Activation Agent:

5 mL of 4/5 polymerisation composition was argon purged for 3 minutes. Now 9 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 4/5 Solution with 5 mg/mL Activation Agent:

5 mL of 4/5 polymerization composition was argon purged for 3 minutes. Now 5 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 4/5 Solution with 2 mg/mL Activation Solution:

5 mL of 4/5 polymerization composition was argon purged for 3 minutes. Now 2 mg/mL of NaAsc (activation solution) was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 3/5 Solution with 9 mg/mL Activation Agent:

5 mL of 3/5 polymerisation composition was argon purged for 3 minutes. Now 9 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 3/5 Solution with 5 mg/mL Activation Agent:

5 mL of 3/5 polymerisation composition was argon purged for 3 minutes. Now 5 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 3/5 Solution with 2 mg/mL Activation Agent:

5 mL of 3/5 polymerisation composition was argon purged for 3 minutes. Now 2 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 2/5 Solution with 9 mg/mL Activation Solution:

5 mL of 2/5 polymerisation composition was argon purged for 3 minutes. Now 9 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 2/5 Solution with 5 mg/mL Activation Agent:

5 mL of 2/5 polymerisation composition was argon purged for 3 minutes. Now 5 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 2/5 Solution with 2 mg/mL Activation Agent:

5 mL of 2/5 polymerisation composition was argon purged for 3 minutes. Now 2 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 1/5 Solution with 9 mg/mL Activation Agent:

5 mL of 1/5 polymerisation composition was argon purged for 3 minutes. Now 9 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 1/5 Solution with 5 mg/mL Activation Agent:

5 mL of 1/5 polymerisation composition was argon purged for 3 minutes. Now 5 mg/mL of NaAsc (activation agent) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The Polymerisation in 1/5 Solution with 2 mg/mL Activation Agent:

5 mL of 1/5 polymerisation composition was argon purged for 3 minutes. Now 2 mg/mL of NaAsc (activation solution) as powder was added to the polymerisation composition, thus, forming the reaction composition, together with an activated solid part (glassy carbon). The reaction composition was stirred together with the activated solid part for 40 minutes.

After the polymerisation, the now polymer brush coated solid part was removed from the reaction composition and washed with acetone.

The polymer brush thickness (nm) for the prepared polymer brushes using of GMA monomers with different Cu and NaAsc concentrations are shown in Table 1.

TABLE 1

The PGMA polymer brush thickness (nm) obtained for polymerisation using different Cu and NaAsc concentrations.

| Cu conc./NaAsc conc. | 2 mg/mL | 5 mg/mL | 9 mg/mL |
|---|---|---|---|
| 1/5 | 62.1 nm | 86.0 nm | 91.2 nm |
| 2/5 | 67.1 nm | 55.3 nm | 76.4 nm |
| 3/5 | 67.9 nm | 29.7 nm | 48.2 nm |
| 4/5 | 24.1 nm | 11.8 nm | 24.8 nm |
| 5/5 | 25.9 nm | 52.5 nm | 14.7 nm |

Below, polymerisation compositions having a Cu catalyst concentration of 5.5 mg/L were prepared as described. The polymerisation compositions were used in the following experiments.

The Effect of Catalyst Concentration and Activation Agent:

To a test tube with a Teflon magnet was added 5 mL polymerisation composition (1.6, 5.5, 12.3, 27.1, and 70.6 mg/L catalyst, respectively) which was then purged for 3 minutes with argon gas. Subsequently, 2, 5, or 9 mg/mL of NaAsc (activation agent) as powder was added. After 20-25 seconds (with argon gas purge in headspace), the initiator terminated samples (glassy carbon—solid part) were added hanging (i.e. the solid part was placed in a suitable holding mechanism and dipped into the reaction composition in order to avoid contact with the stirring magnet), and formation of polymer brushes were obtained stirring the reaction composition at 500 rpm for 40 minutes.

Thereafter, the obtained polymer brush coated solid part was flushed with acetone followed by 5 minutes sonication in acetone as cleaning procedure.

The polymer brush thickness (nm) obtained using the above method for polymerisation of GMA with different known Cu and NaAsc concentrations are shown in Table 2.

TABLE 2

The PGMA polymer brush thickness (nm) obtained for polymerisation using different Cu catalyst and NaAsc concentrations.

| Catalyst Conc/ NaAsc Conc | 2 mg/mL | 5 mg/mL | 9 mg/mL |
|---|---|---|---|
| 1.6 mg/L | 73.7 ± 27.4 nm | 48.9 ± 15.8 nm | 12.6 ± 0.7 nm |
| 5.5 mg/L | 65.9 ± 0.9 nm | 90.9 ± 3.8 nm | 81.2 ± 6.2 nm |
| 12.3 mg/L | 88.3 ± 1.3 nm | 78.7 ± 5.3 nm | 60.9 ± 10.4 nm |
| 27.1 mg/L | 73.1 ± 4.3 nm | 82.8 ± 4.6 nm | 94.4 ± 2.3 nm |
| 70.6 mg/L | 57.4 ± 10.4 nm | 43.6 ± 0.7 nm | 35.5 ± 0.3 nm |

In FIG. 7, Cu catalyst concentration from AAS versus UV-VIS absorbance for various applied reactants is shown. The obtained results shown in FIG. 7 clearly demonstrated that it is possible to obtain compositions with different concentrations of catalyst by changing the Cu-wire magnet stirring time.

Surface Polymerisation Under 0-100% Oxygen Atmosphere:

To a test tube with a Teflon magnet was added 5 mL polymerisation composition (5.5 mg/L catalyst). The polymerisation composition was purged for 3 minutes with oxygen/argon gas mixtures ($O_2$ concentration: 0%, 11%, 21% (atmospheric air), 34%, 58%, and 100%, respectively). Afterwards, 25.0 mg NaAsc (activation agent) was added to each polymerisation composition forming the reaction composition, and after 20-25 seconds (with argon gas purge in headspace), the initiator terminated (glassy carbon—solid part) compositions were added hanging as mentioned above, and polymer brushes were formed stirring the reaction composition at 500 rpm for various periods of times (5, 10, 20, and 40 min., respectively).

After the reaction the now polymer brush coated solid part was flushed with acetone followed by 5 minutes sonication in acetone as cleaning procedure.

Figure 8:
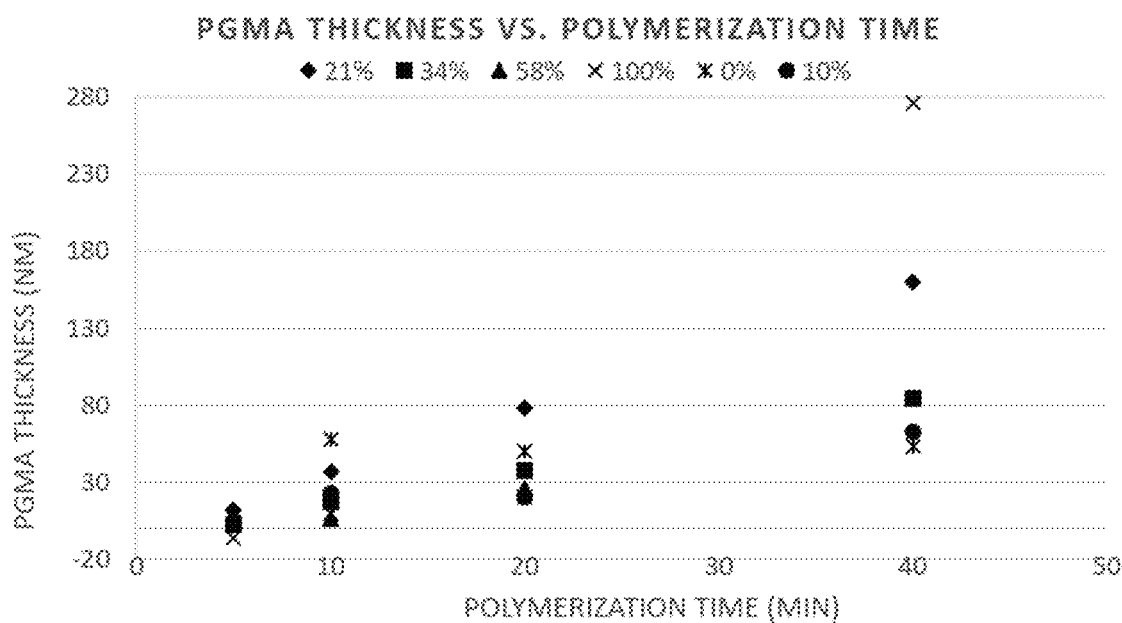
FIG. 8 shows obtained PGMA polymer brush thickness using a Cu catalyst and sodium ascorbate (NaAsc) as activation agent at different oxygen contents during formation of the PGMA polymer brushes.

FIG. 8 shows the PGMA polymer brush thickness obtained from polymerisation for various periods of time under different atmospheric conditions. FIG. 8 shows the PGMA polymer brush thickness (nm) obtained by polymerisation using a Cu catalyst concentration of 5.5 mg/L and a NaAsc activation agent concentration of 5 mg/mL under atmospheres having different oxygen contents.

The obtained results clearly showed that the formation of polymer brushes can be obtained under a broad range of conditions from 0% to 100% oxygen content during the polymerisation.

Forming Block Polymer Brush by Re-Initiating Polymer Brush Samples:

Two PGMA polymer brush-coated glassy carbon solid parts (polymerisation for 5 and 10 minutes, respectively) previously made (under 21% oxygen atmosphere, cf. above) were repolymerised for 10 minutes in 21% oxygen atmosphere using the method for forming polymer brushes as described above under "Surface polymerisation under 0-100% oxygen atmosphere." As monomer, GMA was used. The polymerisation composition and the activation agent were stored at 2-5° C. for 6-8 months prior to use for forming polymer brushes.

Figure 9:
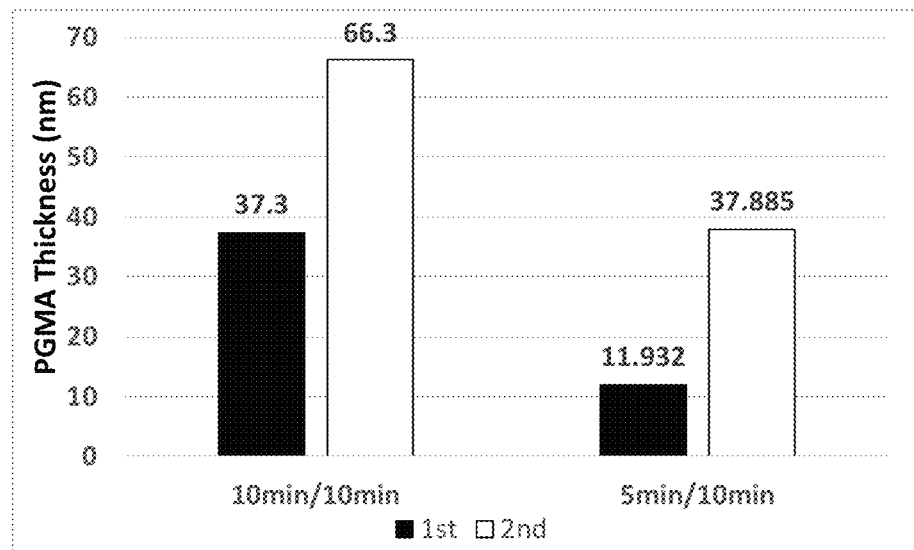
FIG. 9 shows the PGMA polymer brush thickness for a first and a second polymer brush formation on the same solid part.

FIG. 9 shows the PGMA polymer brush thickness after the first and second polymerisations, respectively.

It was further observed that the storage stability of the polymerisation composition and the activation agent was excellent, as the storage of 6-8 months prior to use did not adversely influence the formation of the polymer brushes. The polymerisation composition and the activation agent were stored in discrete containers. Thus, the expected stability was clearly demonstrated.

Catalyst Concentration Effect on Polymerisation Kinetics at 21% Oxygen Content:

A PGMA polymer brush-coated glassy carbon solid part polymerised under an 21% oxygen atmosphere with three different catalyst concentrations (made as described previously) were fabricated. The polymerisation composition and the activation agent were stored at 2-5° C. for 6-8 months prior to use for forming polymer brushes.

Figure 10:
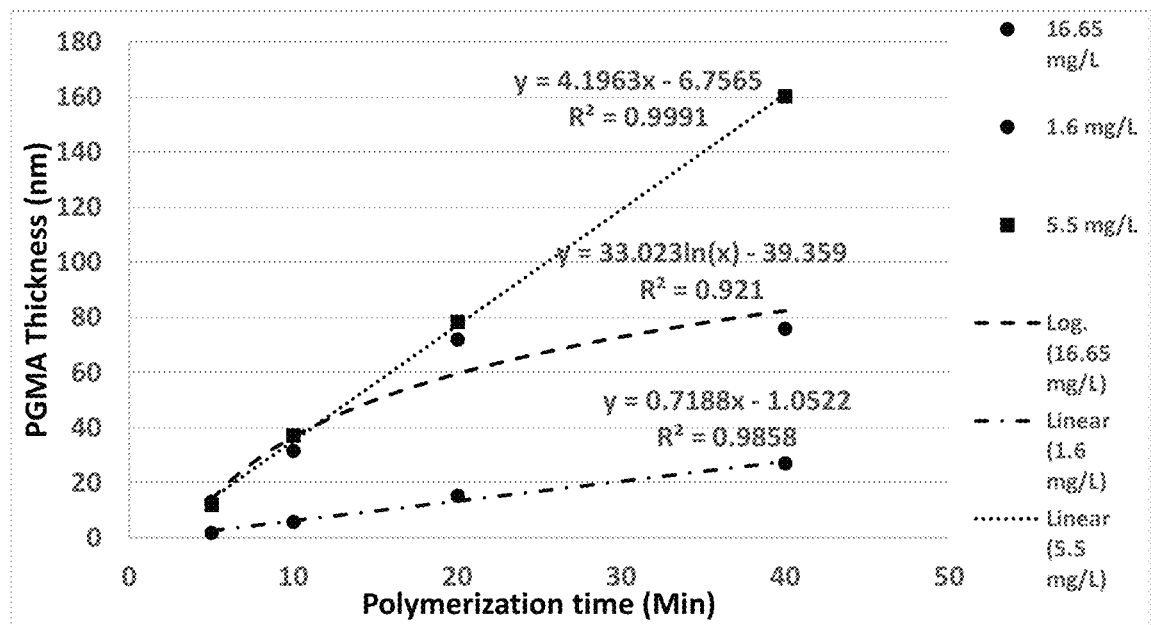
FIG. 10 shows the PGMA polymer brush thickness using various Cu catalyst concentrations, NaAsc activating agent, and the method for forming polymer brushes under 21% oxygen atmosphere.

FIG. 10 shows the PGMA polymer brush thickness obtained from polymerisation for different times with three different concentrations of the catalyst. The PGMA polymer brush thickness (nm) for various polymerisation times obtained using Cu catalyst concentrations of 1.6, 5.5, and 16.65 mg/L, respectively, and a NaAsc activator (activation agent concentration of 5 mg/mL under 21% oxygen atmosphere are shown).

It was further observed that the storage stability of the polymerisation composition and the activation agent was excellent, as the storage of 6-8 months prior to use did not adversely influence the formation of the polymer brushes. Thus, the expected stability was clearly demonstrated.

Example 3

Preparation of Polymer Brushes from Methyl Methacrylate (MMA)

Preparation of the Polymerisation Composition:

6 mL iso-propanol and 0.088 mL N,N,N',N",N"-pentamethyldiethylenetriamine (PMDETA—ligand) were stirred for 2 hours and 45 minutes with a Cu-wire wrapped Teflon magnet. Subsequently, 6 mL MMA was added to the solution, and the Cu-wire wrapped Teflon magnet was removed. The obtained polymerisation composition was stored at 2-5° C. until use.

The Polymerisation in Solution:

5 ml of the above described polymerisation composition was argon purged for 3 minutes. Subsequently, 5 mg/mL of NaAsc (activation agent) as powder was added to the polymerisation composition, thus, forming the reaction composition, together with an activated surface. The reaction composition was stirred together with the activated solid part (glassy carbon) for 60 minutes.

After the polymerisation, the now polymer brush coated solid part was removed from the solution and washed by sonication in HPLC-acetone.

The formed polymer brushes were inspected, and it could be seen that the solid part (glassy carbon) was evenly coated with polymer brushes Polymerisation of MMA on Carbon Fibres:

A Cu-wire (for forming the activating agent) wrapped Teflon magnet is stirred for 30 minutes in a solution of 5 mL iPrOH (solvent) and 0.105 mL TREN (ligand). Afterwards, the Cu-wire wrapped Teflon magnet is flushed with HPLC-acetone and is transferred to another glass container. Now 5 mL MMA (polymer composition) is added to the solution.

5 ml of the above described polymerisation composition is argon purged for 3 minutes and heated to 70° C. Subsequently, 5 mg/mL of NaAsc (activation agent) as powder is added to the polymerisation composition, thus, forming the reaction composition, together with an activated surface. The reaction composition was stirred together with the activated solid part (carbon fibre) for 120 minutes.

After the polymerisation, the now polymer brush coated solid part was removed from the reaction composition and washed by sonication in HPLC-acetone.

Example 4

Further Formation of Polymer Brushes

Table 3 shows other monomers that successfully have been polymerised on surfaces using procedures equivalent to the ones previously shown. The solvent system, dormant transition metal-ligand catalyst and activating agents are further disclosed for each monomer.

The method described in Example 2, subsection "Preparation of polymer brushes from glycidyl methacrylate (GMA) monomers", was used to prepare the polymerisation composition, the activating agent and the reaction composition. The polymer brushes were formed on the solid part according to the method described in Example 2, subsection "The effect of catalyst concentration and activating agent", with changes in reaction time and occasional use of 0% oxygen atmospheres.

TABLE 3

Experimental conditions for polymerisation of other monomers

| Sample | Monomer Solid part | Solvent system | Metal-Ligand (1-45 mg/L) | Activating agent |
|---|---|---|---|---|
| 1 | A - 2.15 mL<br>Glass, Alu, and SS | DMSO/H$_2$O<br>1.85 mL/0.1 mL | Cu-TREN | NaAsc<br>2.0 mg/mL |
| 2 | B - 2.0 mL<br>Glass | iPrOH/H$_2$O<br>0.92 mL/0.07 mL | Cu-TREN | Hydrazine hydrate<br>0.002 mL |
| 3 | B - 2.0 mL<br>Glass | iPrOH/H$_2$O<br>0.92 mL/0.07 mL | Cu-Me$_6$TREN | Hydrazine hydrate<br>0.002 mL |
| 4 | C - 0.31 g<br>Alu, GC | H$_2$O<br>4.0 mL | Cu-Me$_6$TREN | Hydrazine hydrate<br>0.002 mL |
| 5 | C - 0.31 g<br>Alu, GC | H$_2$O<br>4.0 mL | Cu Me$_6$TREN | NaAsc<br>0.036 g |
| 6 | D - 0.984 g<br>Alu | H$_2$O/MeOH<br>1.7 mL/1.7 mL | Cu-Me$_6$TREN | NaAsc<br>0.008 g |
| 7 | E - 1.116 mL<br>Alu | H$_2$O/MeOH<br>1.7 mL/1.7 mL | Cu-Me$_6$TREN | NaAsc<br>0.008 g |
| 8 | E - 1.116 mL<br>Alu | H$_2$O<br>3.4 mL | Cu-Me$_6$TREN | NaAsc<br>0.008 g |
| 9 | F - 1.1 mL<br>Alu | H$_2$O/MeOH<br>1.7 mL/1.7 mL | Cu-Me$_6$TREN | NaAsc<br>0.008 g |
| 10 | G - 0.3 mL<br>GC | iPrOH/H$_2$O<br>1.0 mL/1.8 mL | Cu-Me$_6$TREN | Hydrazine hydrate<br>0.002 mL |
| 11 | H - 0.5 mL<br>SS | H$_2$O/iPrOH<br>1.5 mL/2.0 mL | Cu-Me$_6$TREN | NaAsc<br>0.008 g |

Solvents:
DMSO=dimethyl sulfoxide
H$_2$O=water
iPrOH=isopropanol
MeOH=methanol
Monomers:
A: styrene
B: 2,3,4,5,6-pentafluorostyrene
C: acrylaminde
D: 3-sulfopropyl methacrylate potassium salt
E: [2-(methacryloyloxy)ethyl]dimethyl-(3-sulfopropyl) ammonium hydroxide
F: poly(ethylene glycol) methacrylate
G: 3-(fluorosulfonyl)propyl methacrylate
H: ethylene glycol dimethacrylate
Solid Part:
Alu: Aluminium
SS: Stainless steel
GC: Glassy carbon The formation of the polymer brushes was inspected visually in case of all samples 1-12 using a combination of water contact angle measurement and ellipsometry. It was observed that the polymer brushes were evenly distributed, thus, it was demonstrated that polymer brushes can be formed using a wide range of monomers, solvents, ligands and activating agents.

The invention claimed is:

1. A reaction composition for forming polymer brushes on a surface of a solid part comprising:
    at least one polymerisation composition, and at least one activation agent;
    one or more monomers provided as one or more of (i) a part of the polymerisation composition, (ii) a part of the activation agent, or (iii) a discrete composition;
    wherein the at least one polymerisation composition comprises one or more dormant transition metal catalysts derived from Cu and Fe and selected from Cu$_2$O, CuO, Cu, CuSO$_4$*5H$_2$O, FeO, Fe$_2$O$_3$, and Fe$_3$O$_4$, in combination with a ligand capable of coordinating with the transition metal;
    wherein the at least one activation agent comprises one or more oxygen scavengers;
    wherein the at least one polymerisation composition and the at least one activation agent are provided as discrete compositions; and
    wherein the reaction composition is in contact with the solid part comprising polymerisation initiators immobilised on the surface.

2. The reaction composition according to claim 1, wherein each of the at least one polymerisation composition and the at least one activation agent can be stored at any suitable temperature until use.

3. The reaction composition according to claim 1, wherein the one or more oxygen scavengers are selected from sodium ascorbate, ascorbic acid, hydrazine, hydrazine hydrate, sodium hypophosphite, a mixture of iron powder and sodium chloride, hydrogen carbonate, citric acid, and pyrogallic acid, as well as mixtures thereof.

4. The reaction composition according to claim 1, further comprising one or more solvents.

5. The reaction composition according to claim 1, wherein the monomers are selected from acrylates, methacrylates, halogen-substituted alkenes, acrylamides, methacrylamides, and styrenes, as well as mixtures thereof.

6. The reaction composition according to claim 1 wherein the reaction composition is formed by mixing the polymerisation composition and the activation agent.

7. The reaction composition according to claim 1, wherein the at least one dormant transition metal catalyst is activated by mixing the polymerisation composition and the activation agent.

8. A method of forming polymer brushes on a solid part comprising the steps of:

providing the solid part having polymerisation initiators immobilised on a surface of said solid part, mixing a polymerisation composition and an activation agent, further comprising one or more monomers provided as one or more of (i) part of the polymerisation composition, (ii) part of the activation agent, or (iii) a discrete composition, to form a reaction composition of, wherein the polymerisation composition comprises one or more dormant transition metal catalysts derived from Cu and Fe and selected from $Cu_2O$, CuO, Cu, $CuSO_4*5H_2O$, FeO, $Fe_2O_3$, and $Fe_3O_4$, in combination with a ligand capable of coordinating with the transition metal, wherein the activation agent comprises one or more oxygen scavengers, and the method further comprises bringing the reaction composition and the solid part into contact either mixed prior to contact with the solid part, or mixed upon contact with the solid part, thereby initiating surface polymerisation on the solid part, whereby polymer brushes are formed via the polymerisation initiators on the surface of the solid part.

9. The method according to claim 8, wherein the solid part is immersed into the reaction composition.

10. The method according to claim 8, wherein the reaction composition is sprayed or painted onto the solid part.

11. The method according to claim 8, wherein the solid part is brought into contact with either of the polymerisation composition and the activation agent, followed by adding the other of the polymerisation composition and the activation agent.

12. The method according to claim 8, wherein the solid part is selected from metal, alloy, glass, ceramics, plastics, carbon-based materials such as carbon fibres, glassy carbon, graphene, graphite, and composite materials, and combinations thereof.

13. The method according to claim 8, wherein the method is repeated in order to form another block of polymer brushes on top of the existing layer of polymer brushes.

14. The method according to claim 8, wherein the formation of polymer brushes take place under atmospheric conditions.

15. A polymerisation composition, wherein the polymerisation composition comprises:

one or more dormant transition metal catalysts derived from Cu and Fe and selected from $Cu_2O$, CuO, Cu, $CuSO_4*5H_2O$, FeO, $Fe_2O_3$, and $Fe_3O_4$, in combination with a ligand capable of coordinating with the one or more dormant transition metal catalysts and one or more monomers;

wherein the dormant transition metal catalyst can be activated on demand by an oxygen scavenger; and wherein the polymerisation composition is in contact with a solid part comprising polymerisation initiators immobilised thereon.

16. The polymerisation composition according to claim 15, wherein the polymerisation composition is dormant and such that no chemical reactions can take place.

17. The method according to claim 8 for use in bonding of polymer materials to metals, bonding of functional thermoplastics to glass, bonding of composite fillers functionalized with polymer brushes into the matrix of polymers as composite materials, creating functional surfaces on glasses, metals or plastic materials, creating low friction surfaces on glasses, metals or plastic materials, and creating self-cleaning surfaces on glasses, metals or plastic materials.

18. The reaction composition according to claim 2, wherein each of the at least one polymerisation composition and the at least one activation agent can be stored at a temperature below 5° C.

19. The reaction composition according to claim 2, wherein each of the at least one polymerisation composition and the at least one activation agent can be stored at a temperature 8° C.

20. The reaction composition according to claim 1, wherein the activation agent regenerates the dormant transition metal catalyst into an active transition metal catalyst.

21. The reaction composition according to claim 1, wherein the ligand is a nitrogen-containing ligand.

22. The reaction composition according to claim 21, wherein the nitrogen-containing ligand is selected from the group consisting of N,N,N',N'',N'''-pentamethyldiethylenetriamine (PMDETA), tris[2-(dimethylamino)ethyl]-amine ($Me_6TREN$), tris(2-aminoethyl)amine (TREN), tris(2-pyridylmethyl)amine (TPMA), and 2,2'-bipyridil (BiPy).

23. The reaction composition according to claim 4, wherein the solvent is part of the polymerisation composition, part of the activation agent, or provided as a discrete solution.

24. The reaction composition according to claim 4, wherein the solvent is part of the polymerisation composition, part of the activation agent, and provided as a discrete solution.

25. The reaction composition according to claim 4, wherein a concentration of each component relative to the one or more solvents is in the range of from 0.1 nM to 35 M.

26. The reaction composition according to claim 24, wherein:
the monomer concentration relative to the solvent is from 0.01 M to 5 M;
the oxygen scavenger concentration relative to the solvent is from 0.01 M to 0.045 M; and
the dormant transition metal catalyst concentration relative to the solvent is from 1.0 ppb to 500.0 ppm.

27. The reaction composition according to claim 1, wherein the polymerisation composition and other solutions or components are mixed prior to contact with a solid part, or mixed upon contact with a solid part.

28. The polymerisation composition according to claim 15, further comprising one or more solvents.

29. The polymerisation composition according to claim 15, wherein the polymerisation composition is stored at a temperature below 5° C.

30. The polymerisation composition according to claim 15, wherein the polymerisation composition is stored at a temperature below 8° C.

31. The polymerisation composition according to claim 15, wherein the one or more oxygen scavengers are selected from sodium ascorbate, ascorbic acid, hydrazine, hydrazine hydrate, sodium hypophosphite, a mixture of iron powder and sodium chloride, hydrogen carbonate, citric acid, and pyrogallic acid, as well as mixtures thereof.

32. The polymerisation composition according to claim 15, wherein the ligand is a nitrogen-containing ligand.

33. The polymerisation composition according to claim 31, wherein the nitrogen-containing ligand is selected from the group consisting of N, N,N',N'',N'''-pentamethyldiethylenetriamine (PMDETA), tris[2-(dimethylamino)ethyl]amine ($Me_6TREN$), tris(2-aminoethyl)amine (TREN), tris (2-pyridyl-methyl)amine (TPMA), and 2,2'-bipyridil (BiPy).

34. The polymerisation composition according to claim 15, wherein the one or more monomers are selected from acrylates, methacrylates, halogen-substituted alkenes, acrylamides, methacrylamides, and styrenes, as well as mixtures thereof.

35. The polymerisation composition according to claim 31, wherein a concentration of each component relative to the solvent is in the range of from 0.1 nM to 35 M.

36. The polymerisation composition according to claim 34, further comprising one or more solvents, wherein:
- a concentration of the one or more monomers relative to the one or more solvents is from 0.01 M to 5 M; and
- the dormant transition metal catalyst concentration relative to the one or more solvents is from 1.0 ppb to 500.0 ppm.

* * * * *